United States Patent [19]
Krisch et al.

[11] 4,038,543
[45] July 26, 1977

[54] SCANNING TRANSMISSION ELECTRON MICROSCOPE INCLUDING AN IMPROVED IMAGE DETECTOR

[75] Inventors: Burkhard Krisch; Lee H. Veneklasen; Dieter Willasch, all of Berlin, Germany

[73] Assignee: Siemens Aktiengesellschaft, Munich, Germany

[21] Appl. No.: 696,475

[22] Filed: June 15, 1976

[30] Foreign Application Priority Data

July 8, 1975  Germany .............................. 2530844

[51] Int. Cl.$^2$ ...................... H01J 37/26; G01N 23/04
[52] U.S. Cl. ..................................... 250/307; 250/311
[58] Field of Search ............... 250/306, 307, 309, 310, 250/311

[56] References Cited

U.S. PATENT DOCUMENTS

| 3,504,176 | 3/1970 | Thon | 250/311 |
| 3,908,124 | 9/1975 | Rose | 250/311 |

Primary Examiner—Craig E. Church
Attorney, Agent, or Firm—Kenyon & Kenyon, Reilly, Carr & Chapin

[57] ABSTRACT

A scanning transmission electron microscope including an evacuated housing and a phase contrast device in which the imaging ray cone of the microscope generates a hologram having zones of positive or negative interference. The microscope includes means for separately detecting and measuring the intensities of the zones of positive or negative interference and a picture display means coupled to and controlled by the detecting means for monitoring the intensities detected and measured.

The improvement of the invention comprises an improved detecting means including an image converter disposed in the electron beam path of the microscope on which the hologram is projected for converting the hologram into an optical image. Planar image masks are disposed outside of the microscope housing and have transparent and opaque areas which correspond to the zones of positive and negative interference of the hologram. An image transmission means, disposed adjacent the image converter, transmits the optical image with unchanged relative intensity distribution to the masks, and means, disposed adjacent the masks and coupled to the display means, measures the intensity of light transmitted through the transparent areas of the mask and generates an output signal corresponding to the intensities measured and detected for display on the display means.

A method for correcting astigmatism and/or defocusing in such a microscope is also disclosed.

15 Claims, 18 Drawing Figures

SCANNING TRANSMISSION ELECTRON MICROSCOPE INCLUDING AN IMPROVED IMAGE DETECTOR

BACKGROUND OF THE INVENTION

1. Field of the Invention

This invention relates generally to corpuscular beam microscopes, specifically an electron microscope, and in particular to a scanning transmission electron microscope in which the intensities of hologram zones having positive or negative interference generated by the imaging ray cone of the microscope are separately measured by a detector and the measured values of the intensities are utilized to control a picture display tube monitor.

2. Description of the Prior Art

Scanning transmission electron microscopes ("STEM") are generally known in the art. See, for example, the technical publication of H. Rose, "Phase Contrast in Scanning Transmission Electron Microscopy," 39 *Optik* pp. 416–436 (1974). As described in the foregoing publication, a hologram is generated in a scanning transmission electron microscope in a plane which is disposed behind the specimen of the irradiated specimen element at any point in time. This hologram is produced as a result of interference which occurs between the imaging ray cone originating at the specimen element and the primary imaging ray cone.

It has been proposed in Rose's article to provide a detector arrangement in the imaging ray cone of such a microscope comprising a partial area detector consisting of several ring zones, and a full area detector disposed in the shadow of the partial area detector. By utilizing an appropriate design, one of these partial detectors will register the positive, i.e., constructive, interference zone of the hologram, and the other partial detector will register the negative, i.e., destructive, interference zone of the hologram. The output signals generated by the two partial detectors can be combined as required.

The present invention is directed to solving the problem of facilitating the foregoing detection operation in a scanning transmission electron microscope and of expanding the field of its possible applications, particularly with respect to resolution and pattern recognition in such microscopes.

SUMMARY OF THE INVENTION

It is therefore an object of the present invention to provide a scanning transmission electron microscope in which a solution to the foregoing problem can be achieved.

It is also an object of the present invention to provide a scanning transmission electron microscope which includes an improved means for detecting and measuring the light intensities of the zones of positive and negative interference of a hologram generated by the imaging ray cone of such a microscope.

These and other objects of the invention are achieved in a scanning transmission electron microscope which includes an evacuated housing and phase contrast device and in which the imaging ray cone of the microscope generates a hologram having zones of positive or negative interference. The microscope includes means for separately detecting and measuring the intensities of the zones of positive or negative interference and display means coupled to and controlled by the detecting means for monitoring the intensities detected and measured.

The improvement of the invention comprises the detecting means comprising an image conversion means disposed in the electron beam path of the microscope on which the hologram is projected for converting the hologram into an optical image. Planar mask means are disposed outside of the microscope housing and have transparent and opaque areas which correspond to the zones of positive and negative interference of the hologram. Means for transmitting the optical image produced by the image conversion means with unchanged relative intensity distribution to the mask means are disposed adjacent the image conversion means. Finally, means for measuring the intensity of light transmitted through the transparent areas of the mask means and for generating an output signal corresponding to the intensities detected and measured for display on the display means are disposed adjacent the mask means behind the mask means along the optical image path of the transmission means and are coupled to the display means.

In the foregoing arrangement, the mask means is located outside of the evacuated microscope housing and comprises part of a light-optical ray system. The inherent advantage of this arrangement is that the mask means may be moved, may be interchanged with another mask means, or may be adapted to the imaging conditions of the microscope and the structures of specimen elements being examined in an extremely simple manner.

In one embodiment of the invention, the image transmitting means of the microscope detector may comprise an image divider having two separate optical image transmission paths, each of which is adapted to transmit the optical image produced by the image conversion means with equal intensity and unchanged relative intensity distribution. The mask means comprises first and second planar image masks, each disposed along one of the image transmission paths outside of the microscope housing and which have complimentary transparent and opaque areas with respect to each other. The detecting and measuring means comprises first an second photometers disposed adjacent the masks after the masks along the image transmission paths which measure the total intensity of the light passing through the transparent areas of each mask and generate an output signal corresponding to the measured light intensities of the optical image transmitted thereto. Means, coupled to the photometers and to the display means, are provided for subtracting the output signals generated by the photometers and generating a difference signal corresponding to the intensity detected and measured for display on the display means.

The latter embodiment of the invention enables the information content of the hologram to be utilized exhaustively. The concept of substracting the signals corresponding to the intensities of the two interference zones of the hologram has been disclosed by Rose.

These and other features of the invention will be described in greater detail in the following detailed description.

BRIEF DESCRIPTION OF THE DRAWINGS

In the drawings, wherein similar reference numerals denote similar elements throughout the several views thereof.

DETAILED DESCRIPTION

Figure 1:
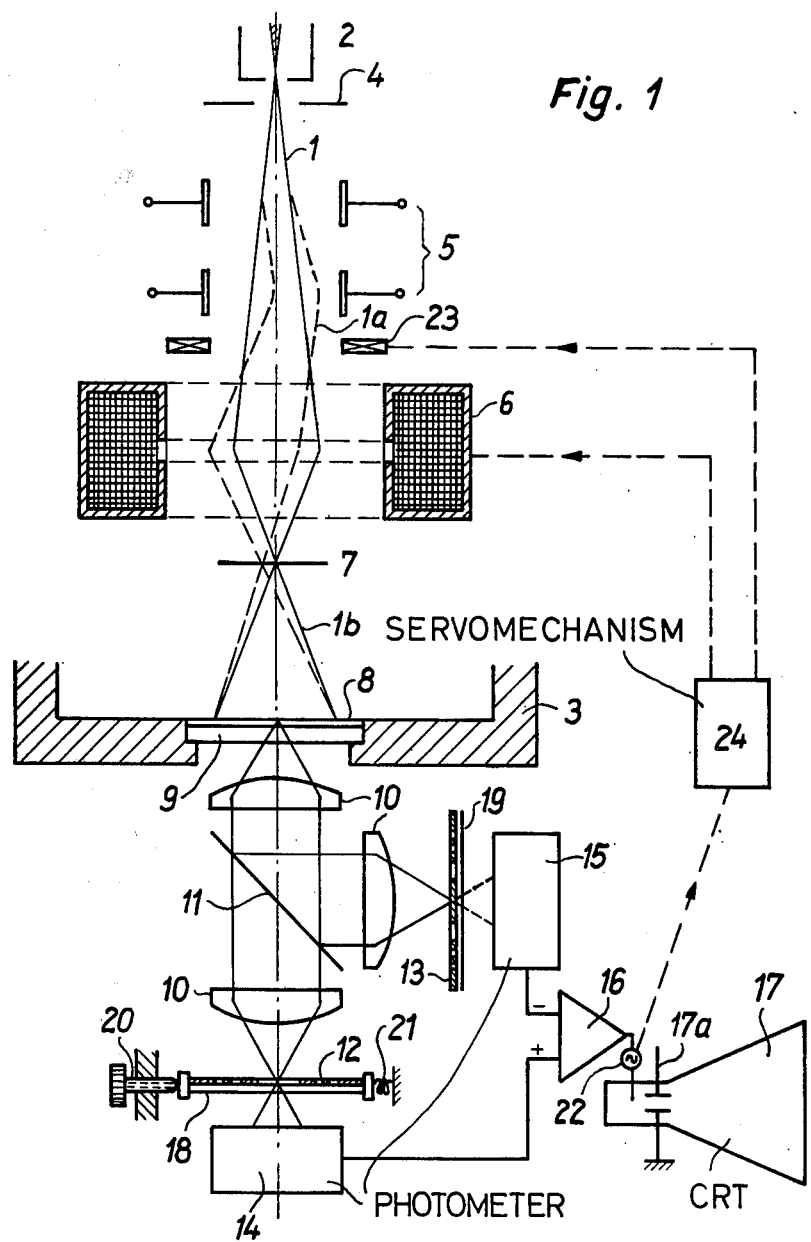
FIG. 1 is a schematic illustration of a scanning transmission electron microscope including an improved means for detecting and measuring the intensities of the zones of positive and negative interference of a hologram generated in the microscope constructed according to the invention.

Referring now to the drawings, and in particular to FIG. 1, there is shown, in schematic form in the upper part of the figure, a conventionl scanning transmission electron microscope. In the microscope, an electron beam 1 emanates from an electron source 2 which preferably comprises a field emission cathode. After acceleration by an anode 4, the electron beam passes through a deflection system 5 and is focused by an objective lens 6 on a specimen 7. Deflection system 5 comprises electrostatic or magnetic deflection elements, two pairs of which are illustrated in the drawings. Two additional pairs of deflection elements (not shown) are disposed perpendicular to the plane of the drawing in the microscope. Electron beam 1 is shown in a deflected position by the dashed lines identified by reference numeral 1a. Beam 1 passes through specimen 7 and strikes a transparent fluorescent screen 8 in the form of a cone 1b. The fluorescent screen is supported by a glass window 9 in the bottom 3 of the housing of the microscope, and the electron beam is deflected in a manner so that cone 1b always illuminates the same area of fluorescent screen 8. Screen 8 preferably has as little persistence as possible, preferably not significantly longer than the time in which an element of specimen 7 is irradiated. A persistence of 1 us or less is desirable. A scintillation screen may be utilized, if desired, in place of the transparent fluorescent screen.

A light-optical image divider is disposed beneath window 9 of the microscope. This divider consists of a plurality of optical lenses 10 and a semi-transparent mirror 11. The image divider images the fluorescent screen on a pair of masks 12 and 13 with one half the intensity on each. In the illustrated embodiment of the invention, masks 12 and 13 are rotation symmetrical masks, i.e., their transparent and opaque areas are in the form of circles or circular rings. The masks are also complimentary, i.e., where mask 12 is transparent, mask 13 is opaque, and vice versa.

Photometers 14 and 15 are disposed behind masks 12 and 13 along the optical image transmission paths of the image divider. These photometers may comprise, for example, photomultipliers and measure the total intensity, i.e., the intensity integrated over the area of the masks, of the light passed by masks 12 and 13, respectively. The photometers generate output voltages or currents which are subtracted from each other by a subtraction device, for example, an operational amplifier 16, and the difference signal is transmitted to a display tube monitor 17, e.g., a cathode ray tube, for intensity modulation. The monitor includes a deflection system 17a which is controlled synchronously with deflection system 5 of the microscope.

In addition to masks 12 and 13, the microscope may include attenuating filters 18 and 19 disposed adjacent the masks behind the masks along the image transmission paths of the image divider. These attenuating filters have a continuous density distribution. Masks 12 and 13 may also have as attenuating filters instead continuous density directly in their transparent areas. Each of the masks is movable with attenuating filters 18 and 19 transversely in their respective planes by means of a position adjusting mechanism. One embodiment of such a mechanism is illustrated in conjunction with mask 12 and comprises adjusting screw 20 which engages the mask and acts against the force of a coil spring 21 fastened to the mask. The function of masks 12 and 13, as well as attenuating filters 18 and 19, is described subsequently herein.

Figure 2:
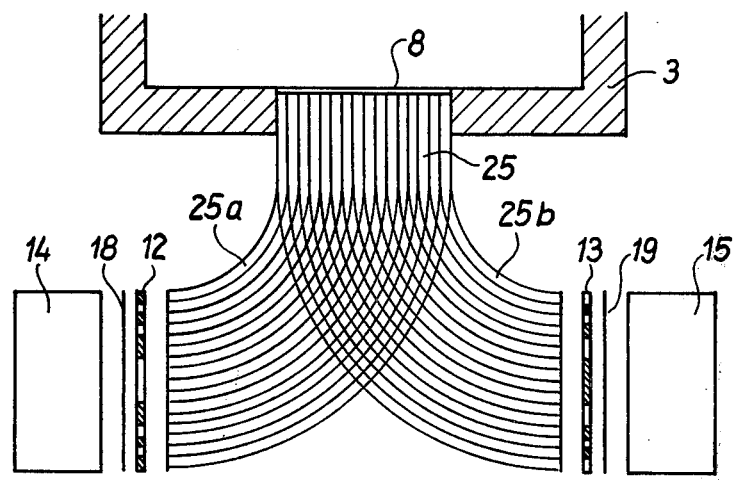
FIG. 2 is a partial schematic diagram of another embodiment of a scanning transmission electron microscope including an improved detecting means constructed according to the invention.

FIG. 2 illustrates another embodiment of the invention in which the image divider comprises a bundle 25 of light-conducting fibers. The fibers form a vacuum-type seal at the bottom 3 of the microscope housing and are divided outside the microscope housing into two sub-bundles 25a and 25b. The fibers of each of the sub-bundles are uniformly distributed over the area of fluorescent screen 8 and transmit the entire optical image of screen 8 to masks 12 and 13, attenuating filters 18 and 19, and photometers 14 and 15. Similar to the embodiment of the invention illustrated in FIG. 1, the photometers are coupled by means of a subtraction device to a display tube monitor for evaluation of the image.

Figure 3:
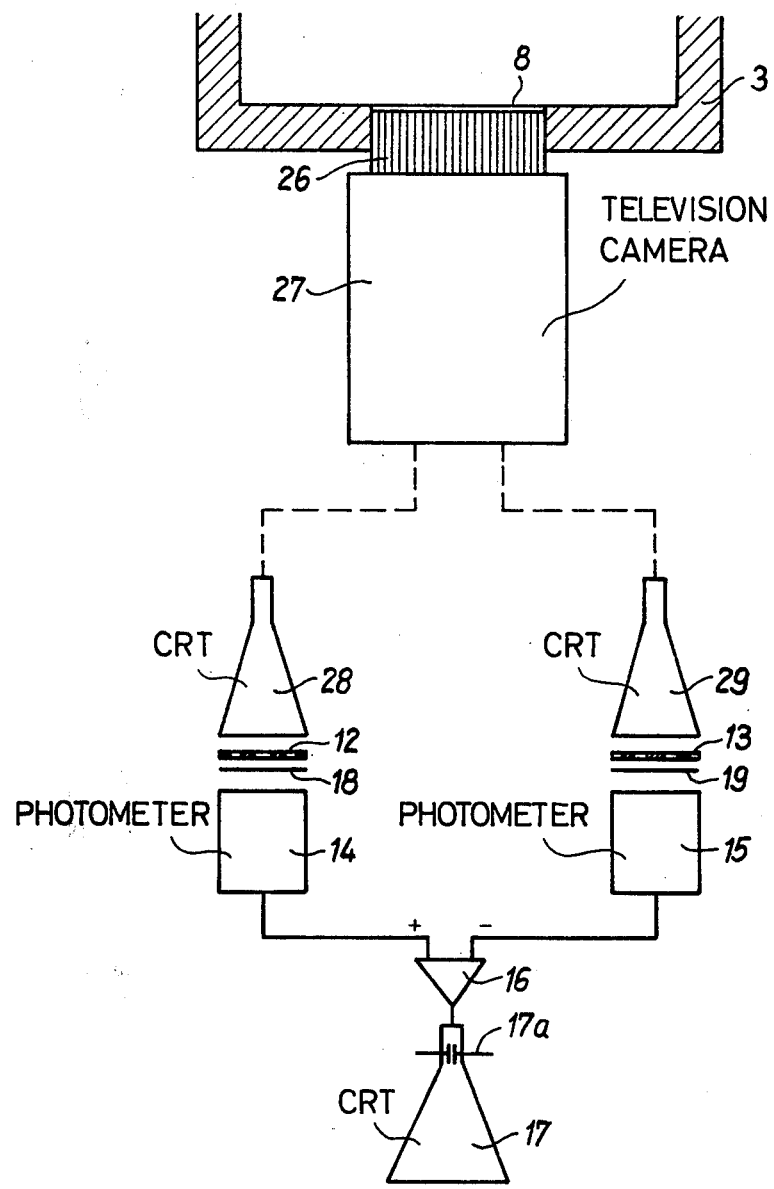
FIG. 3 is a partial schematic diagram of still another embodiment of a scanning transmission electron microscope including an improved detecting means constructed according to the invention.

In the embodiment of the invention illustrated in FIG. 3, a television camera 27 is coupled to fluorescent screen 8 by means of a fiber-optic bundle 26. Camera 27 controls the brightness of two picture-reproducing tubes 28 and 29, which may comprise cathode ray tubes, so that the images of screen 8 are produced on the display screens of tubes 28 and 29 with equal intensity. Complimentary image masks 12 and 13 and attenuating filters 18 and 19 are disposed adjacent and in front of the screens of tubes 28 and 29. Photometers 14 and 15 are also provided for measuring the total intensity of the light passing through the masks and attenuating filters from tubes 28 and 29. The photometers generate output signals which are transmitted to a subtraction device, i.e., operational amplifier 16, coupled to a picture display tube 17. The deflection system 17a of this tube is synchronously controlled with deflection system 5 of the microscope.

In the latter embodiment of the invention, the frame time of television camera 27, as well as the frame time of tubes 28 and 29, must be substantially shorter than the time it takes the microscope to scan a field of the specimen once by means of deflection system 5. In scanning transmission electron microscopes, one scanning of a field of the specimen takes approximately 10 to 100 seconds. Thus, a minimum frequency of 2.5 kHz/frame, and a frame time of 0.4 ms is, accordingly, required for camera tube 27 and display tubes 28 and 29.

Figure 4:
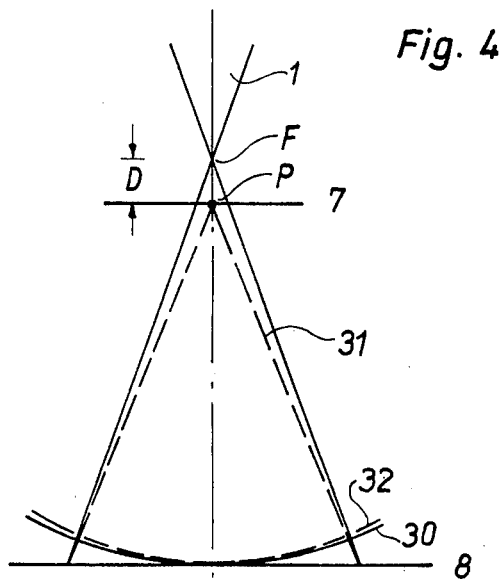
FIG. 4 is a graphical illustration of the electron beam of a scanning transmission electron microscope illustrating the generation of a hologram in the microscope.

The operation of the microscope is as follows:

Assuming that electron beam 1 is focused some distance above specimen 7 at the point F, as illustrated in FIG. 4, the beam will pass through specimen 7 and arrive at the detector 8 with a wave front 30. A scatter cone 31 will start at the same time from a point P of specimen 7, for example, from a single atom, and arrives at detector 8 with a wave front 32. As can be seen from FIG. 4, a phase difference exists between wave fronts 30 and 32 at detector 8. Since the wave front of beam 1 is substantially coherent, a hologram of the point P is produced on detector 8.

Figure 5:
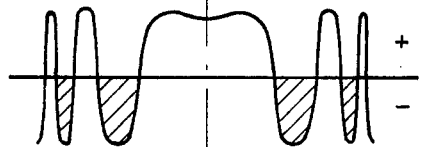
FIG. 5 is a graphical illustration of the intensity distribution of the hologram illustrated in FIG. 4 after subtracting the background emanating from the electron beam of the microscope.

FIG. 5 illustrates the intensity distribution of the hologram of the point P after subtracting from the hologram the background emanating from electron beam 1. This intensity distribution is a result not only of the geometry illustrated in FIG. 4, but also of the imaging errors, particularly the aperture error of objective lens 6, which cause wave front 30 to deviate from a spherical shape. As shown in FIG. 5, the hologram has zones of equal phase, i.e., positive interference, and zones of opposite phase, i.e., negative interference, the latter of which are shaded in the drawings. If detector 8 is designed so that signals representative of the positive interference zones and the negative interference zones are separately measured and then are subtracted from each other, a difference signal having an intensity distribution such as that illustrated in FIG. 7 is generated which contains all the information about the point P.

Figure 6:
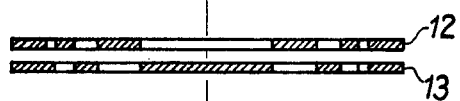
FIG. 6 is a cross-sectionl plan view of the image masks of an improved detecting means constructed according to the invention.

The foregoing principle follows from the Rose publication previously referred to herein. However, while Rose obtains a difference signal having an intensity distribution of the type illustrated in FIG. 7 by acting directly upon the electron-optical ray path of the microscope, the present invention first brings the hologram illustrated in FIG. 5 outside the vacuum of the microscope housing by means of an electron-to-light image converter and evaluates the image by means of light-optical, selective elements including masks 12 and 13, which are illustrated for the purposes of this explanation in planar cross-section in FIG. 6. As can be seen from the figure, mask 12 is transparent for the positive interference regions of the light image shown in FIG. 5 and mask 13 is transparent for the negative regions of that light image. The masks are rotation symmetrical about a central axis normal to the surface of the masks and are adapted for imaging a point.

It is known that the outer portions of a hologram having an intensity distribution of the type illustrated in FIG. 5 are of particular significance for the resolution of a scanning transmission electron microscope. The present invention can be utilized to increase the influence of these portions of the hologram by utilizing the attenuating filters 18 and 19, previously described herein, which have a density distribution illustrated in FIG. 8, in conjunction with masks 12 and 13. As a result of doing so, an intensity distribution of the type illustrated in FIG. 9 is obtained from the distribution illustrated in FIG. 7. The amplitude of the signal illustrated in FIG. 9 can be increased by a measuring amplifier to compensate for the light-optical attenuation. Attenuating filters 18 and 19 have the same density distribution in this arrangement.

Figure 10:
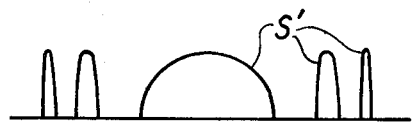
FIG. 10 is a cross-sectional plan view of an image mask for use in a detecting means constucted according to the invention.
Figure 11:
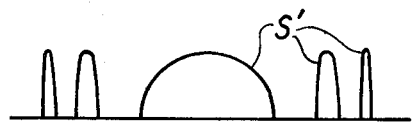
FIG. 11 is a graphical illustration of the density of an attenuating filter matched to the mask illustrated in FIG. 10 of a detecting means constructed according to the invention.
Figure 12:
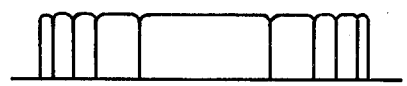
FIG. 12 is a graphical illustration of the intensity distribution detected by a detecting means constructed according to the invention where the density curve of an attenuating filter has a shape the same as the cusps of the intensity distribution illustrated in FIG. 5.
Figure 13:
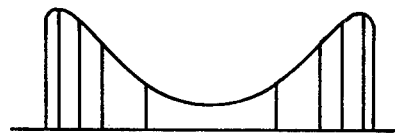
FIG. 13 is a graphical illustration of the intensity distribution detected by a detecting means constructed according to the invention utilizing an attenuating filter having the density distribution illustrated in FIG. 8.
Figure 7:
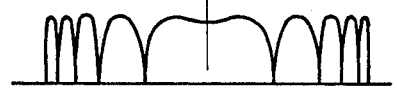
FIG. 7 is a graphical illustration of the intensity distribution of the hologram illustrated in FIG. 4 after subtracting the positive zones of interference from the negative zones of interference of the hologram.

The attenuating filters can also be used to fill in the valleys between the cusps of the intensity distribution illustrated in FIG. 7 and thereby increase contrast. FIG. 11 illustrates a density curve S' of an attenuating filter which is matched to the mask illustrated in FIG. 10. This density curve S' may have approximately the same shape as the cusps of the distribution illustrated in FIG. 5, the latter of which are passed by the mask illustrated in FIG. 10. As a result, the intensity distribution shown in FIG. 12 is obtained in which the cusps are flattened and form a common plateau. Another attenuating filter having a density curve S as shown in FIG. 8 can also be used, in which case an intensity distribution such as that shown in FIG. 13 is obtained.

Figure 8:
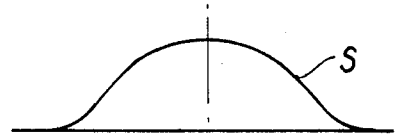
FIG. 8 is a graphical illustration of the density distribution of the attenuating filters of a detecting means constructed according to the invention.
Figure 9:
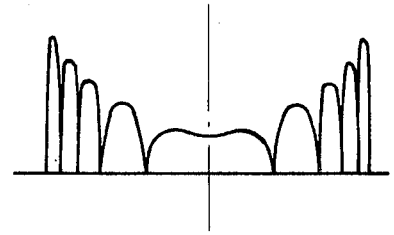
FIG. 9 is a graphical illustration of the hologram illustrated in FIG. 5 in modified form resulting from the use of attenuating filters in a detecting means constructed according to the invention.

Attenuating filters 18 and 19 can be combined with masks 12 and 13 in a single structural element by blackening the light-transparent areas of the masks directly in accordance with the density curves shown in FIGS. 8 and 11. In theory, however, it is also possible to utilize only a single attenuating filter having a suitable density distribution in the light-optical ray path ahead of the image divider either directly behind fluorescent screen 8 or at the point of a real image of the screen which is projected by an additional light-optical lens system in front of the image divider. It is preferable, however, for reasons of better adaptability, to utilize attenuating filters 18 and 19 as individual components in conjunction with masks 12 and 13.

As can be seen from the foregoing description, it is extremely simple in a scanning transmission electron microscope constructed according to the invention to replace the masks and to adapt them to the electron-optical imaging properties of the microscope as well as to the objects which are to be imaged. It is also extremely simple to achieve the same with respect to the attenuating filters. Since both the masks and the filters are located outside the microscope housing in the light-optical ray paths, the evacuated housing of the microscope need not be entered to achieve mask replacement or adjustment. Attenuating filters, moreover, cannot be used in the electron-optical ray path of the microscope. The masks can be prepared without difficulty if they are provided with isolated areas by depositing opaque coatings on glass since the masks need be transparent only to light.

The foregoing discussion is also applicable where the focus F (see FIG. 4) is located below or on, rather than above, specimen 7. In this case, only the imaging properties of objective lens 6 will affect the hologram shown in FIG. 5.

In the embodiments of the invention shown in FIGS. 1-3, the output signal of only one image transmission path, for example, the output signal of photometer 14, need be utilized to control the brightness of display monitor 17. Also the image divider may be dispensed with altogether and only a single transmission path system for imaging fluorescent screen 8 on mask 12 may be utilized. In the latter case, only one half of the information contained in the hologram will be utilized, but the advantage of the invention, namely, that the hologram is evaluated by elements, i.e., the masks and attenuating filters, which are disposed outside the microscope, is retained. It is also possible not only to subtract the output signals generated by each of the image transmission paths, but, in addition, to combine the signals in any desired manner or to vary the magnitude of the signals by means of amplifiers coupled to photometers 14 and 15.

Figure 14:
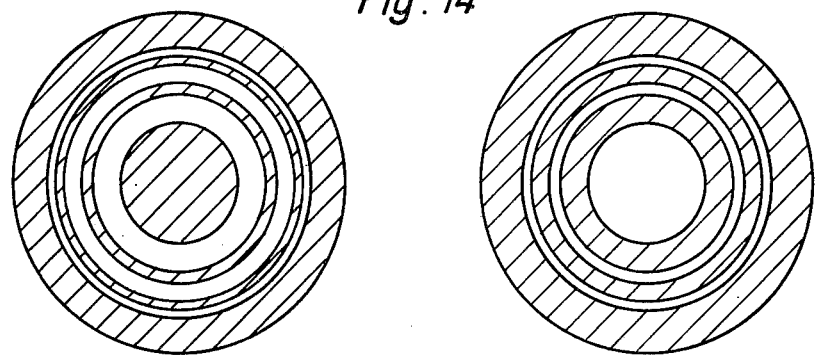
FIGS. 14, 15 and 16 are cross-sectional plan views of complimentary pairs of masks for increasing the resolution and for pattern recognition of specimens in a detecting means constructed according to the invention.
Figure 15:
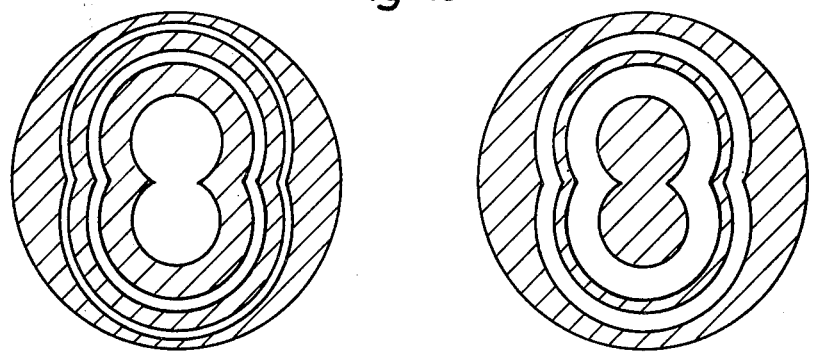
Figure 16:
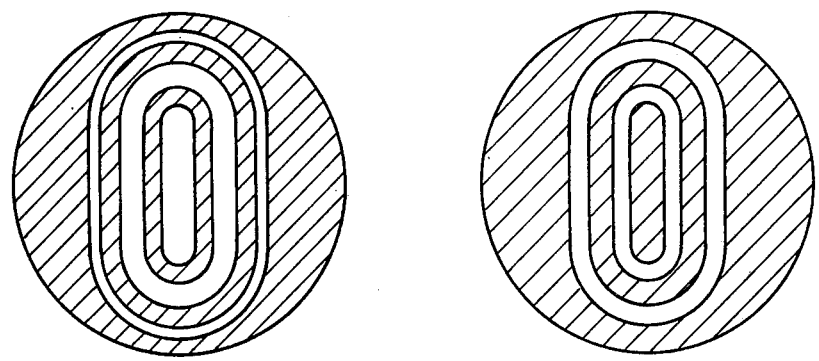

FIGS. 14, 15 and 16 illustrate complimentary pairs of masks which can be utilized to increase the resolution and for pattern recognition of certain specimen structures in the microscope. The masks illustrated in FIG. 14 are adapted for the imaging of a point, those illustrated in FIG. 15 are adapted to image a pair of points, and those shown in FIG. 16 are adapted for imaging an approximately rod-shaped specimen structure. These masks may be prepared by constructing a macroscopic model of the desired structure and then taking a photographic hologram of the model by suitable light-optical means.

Figure 17:
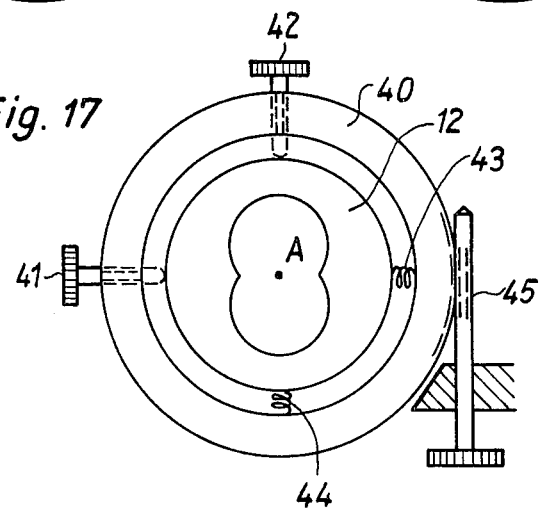
FIG. 17 is a schematic illustration of means for adjusting the position of non-rotation symmetrical masks in a detecting means constructed according to the invention.

For example, a suitable model for the masks shown in FIG. 14 would be a circular disc disposed on a glass plate. With respect to FIG. 15, a pair of disc would be suitable as the model. With respect to the masks of FIG. 16, a beam-shaped structure would be a suitable model. The photographic holograms produced are then developed with high contrast such as by copying the holograms several times, and a positive and a negative of each hologram is made. Enhancement of the contrasts in developing the hologram can, however, be dispensed with. The masks then obtained will have a gradual density distribution comprising a direct combination of mask 12 and attenuating filter 18 (see FIG. 1). If non-rotation symmetrical masks are utilized, it is preferable to provide an adjusting mechanism to permit transverse movement and rotational movement of the masks. A suitable mechanism is schematically illustrated in FIG. 17, wherein mask 12 is disposed in a frame 40 which is mounted in the microscope so that it is displaceable by means of drive means 41 and 42 which act against the force of coil springs 43 and 44 fastened to the mask. Frame 40 and mask 12 are rotatable about normal center axis A by means of worm drive 45.

It can be seen from foregoing discussion with respect to FIG. 4 that the intensity distribution of the hologram shown in FIG. 5 depends upon what is known in the art as "defocusing," i.e., the distance D of the focus F from the Point P. Thus, masks 12 and 13 can be matched to the hologram of Point P, only for a given defocusing D'; if there is no such defocusing, coincidence of the positive and negative interference zones of the hologram of FIG. 5 with the corresponding transparent and opaque areas of masks 12 and 13 (shown in FIG. 6) will not occur. As a result, the picture displayed by monitor 17 will have poor contrast. This phenomenon can, however, be used to correct defocusing in the microscope. To achieve this, the a-c component of the output signal which is transmitted to display monitor 17 is measured with a suitable a-c metering device, identified by the reference numeral 22 in FIG. 1. The a-c component of this signal will be large for high contrast of the final picture which is displayed. If the excitation of objective lens 6 is manually adjusted by means of a variable resistor in such a manner that the a-c current measured by metering device 22 is a maximum, than an optimum match of the defocusing D to masks 12 and 13 will be achieved.

It is also possible to correct astigmatism that may be present in the microscope in a similar manner. Such astigmatism also produces a decrease in contrast. In order to correct such astigmatism, a stigmator 23 (see FIG. 1) is provided in the microscope and is similarly adjusted so that the a-c current measured by metering device 22 is a maximum. Thus, by maximizing the a-c current component of the difference signal generated by operational amplifier 16, either by adjusting a variable resistor coupled to objective lens 6, or by adjusting a stigmator provided in the microscope, either defocusing or astigmatism in the microscope can be corrected.

The foregoing defocusing and astigmatism corrections can be carried out automatically, instead of manually as previously described. This can be achieved by the elements schematically illustrated in FIG. 1, which include a servomechanism 24 which is coupled to metering device 22. The current measured by metering device 22 is transmitted to servomechanism 24, and the latter is programmed so that it adjusts, in alternating fashion, the excitation of objective lens 6 and stigmator 23 so that the optimum of both excitations is achieved by successive approximation.

Figure 18:
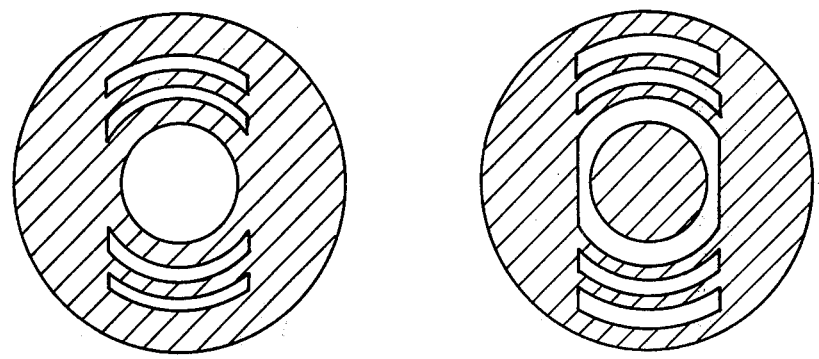
FIG. 18 is a cross-sectional plan view of a rotation-symmetrical mask for use in a detecting means constructed according to the invention.

If electron beam 1 is focused astigmatically, the deviation of the intensity distribution of the hologram from the image masks will depend upon the azimuth in the plane of the hologram on transparent fluorescent screen 8. Correction of astigmatism can, thus, be improved by using non-rotation symmetrical masks. Such masks can be constructed by superimposing an aperture in the form of a slit on rotation symmetrical masks such as those illustrated in FIG. 14. As a result, masks of the type illustrated in FIG. 18 are obtained. By simultaneously rotating the masks shown in the latter figure in the same direction, the astigmatic deviation can be maximized, i.e., the a-c current measured by metering device 22 is minimized. When the masks are in the position in which the astigmatic deviation is maximized, stigmator 23 is adjusted until the a-c current metered by device 22 is maximized.

In the foregoing specificatin, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than in a restrictive sense.

What is claimed is:

1. In a scanning transmission electron microscope including an evacuated housing and a phase contrast device, and in which the imaging ray cone of the microscope generates a hologram having zones of positive or negative interference, said microscope also including means for separately detecting and measuring the intensities of said zones of positive or negative interference and display means coupled to and controlled by said detecting means for monitoring said intensities, the improvement comprising said means for detecting comprising
   image conversion means, disposed in the electron beam path of said microscope, on which said hologram is projected for converting said hologram into an optical image;
   planar mask means, disposed outside of said microscope housing, having transparent and opaque areas which correspond to said zones of positive and negative interference of said hologram;
   means, disposed adjacent said image conversion means, for transmitting said optical image with unchanged relative intensity distribution to said mask means; and
   means, disposed adjacent said mask means and coupled to said display means, for measuring the light intensity transmitted through said transparent areas of said mask means and generating an output signal corresponding to the measured light intensity for display on said display means.

2. The microscope recited in claim 1, wherein said image transmitting means comprises an image divider having two separate image transmission paths each of which is adapted to transmit said optical image with equal intensity and unchanged relative intensity distribution; wherein said mask means comprises first and second planar image masks each disposed along one of said image transmission paths outside of said microscope housing, said masks having transparent and opaque areas which are complimentary with respect to each other; and wherein said measuring means comprises first and second photometers disposed adjacent said masks after said masks along said image transmission paths, said photometers each generating an output signal corresponding to the measured light intensity transmitted through the transparent areas of each of said masks, and means, coupled to said photometers and to said display means, for subtracting said output signals generated by said photometers and generating a difference signal corresponding to the measured intensities for display on said display means.

3. The microscope recited in claim 2, wherein said image divider is adapted for operation in a light-optical mode.

4. The microscope recited in claim 3, wherein said image divider comprises an optical system including a plurality of spaced-apart optical lenses and a semi-transparent mirror disposed between at least two of said lenses.

5. The microscope recited in claim 3, wherein said image divider comprises a fiber-optic image divider.

6. The microscope recited in claim 2, wherein said image divider comprises a television camera tube and a pair of picture display tubes coupled to said camera tube.

7. The microscope recited in claim 1, wherein said image conversion means comprises a transparent fluorescent screen.

8. The microscope recited in claim 1, wherein said image conversion means comprises a scintillation screen.

9. The microscope recited in claim 1, wherein said mask means further comprises attenuating filter means having a gradually varied density disposed outside of said microscope housing and adapted to change the relative intensity distribution of light within said transparent areas of said mask means and/or the ratio of the light intensities transmitted through different ones of said transparent areas of said mask means.

10. The microscope recited in claim 1, wherein said mask means comprises a rotation-symmetrical zone aperture.

11. The microscope recited in claim 1, further comprising means, coupled to said mask means, for moving said mask means transversely to and rotating said mask means about an axis perpendicular to the plane of said mask, for adjusting the position of said mask means.

12. A method for correcting astigmatism and/or defocusing in a scanning transmission electron microscope in which the imaging ray cone of the microscope generates a hologram having zones of positive or negative interference, said microscope including means for separately detecting and measuring the intensities of said zones of positive or negative interference and generating an output signal corresponding to said intensities detected and measured for display on a display means for monitoring said intensities, said output signal including an a-c component, said method comprising the step of correcting said astigmatism or defocusing by maximizing said a-c component of said signal generated by said detecting means.

13. The method recited in claim 12, wherein said microscope includes a stigmator, and wherein said step of maximizing comprises maximizing said a-c component of said difference signal by adjusting said stigmator.

14. The method recited in claim 12, wherein said microscope includes an objective lens, and wherein said step of maximizing comprises maximizing said a-c component of said difference signal by adjusting the excitation of said objective lens.

15. The method recited in claim 13, wherein said detecting means includes mask means to which an optical image of said hologram is transmitted with unchanged relative intensity distribution by an optical image transmission means, said masks comprising a pair of non-rotational, symmetrical planer masks, and wherein said step of maximizing comprises simultaneously rotating said masks in the same direction to maximize astigmatic deviation in said microscope, and subsequently maximizing said a-c component of said difference signal by adjusting said stigmator.

* * * * *